(12) United States Patent
Shor et al.

(10) Patent No.: US 6,842,383 B2
(45) Date of Patent: Jan. 11, 2005

(54) METHOD AND CIRCUIT FOR OPERATING A MEMORY CELL USING A SINGLE CHARGE PUMP

(75) Inventors: Joseph S. Shor, Tel Mond (IL); Avri Harush, Kyriat Bialik (IL); Shai Eisen, Tel Aviv (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 10/354,050

(22) Filed: Jan. 30, 2003

(65) Prior Publication Data

US 2004/0151034 A1 Aug. 5, 2004

(51) Int. Cl.⁷ ................................................ G11C 7/00
(52) U.S. Cl. ......................... 365/189.09; 365/185.18; 365/226; 327/538
(58) Field of Search .................. 365/189.09, 189.11, 365/185.18, 185.28, 226; 327/538, 541, 543

(56) References Cited

U.S. PATENT DOCUMENTS

| | | | |
|---|---|---|---|
| 4,961,010 A | | 10/1990 | Davis |
| 5,081,371 A | | 1/1992 | Wong |
| 5,276,646 A | | 1/1994 | Kim et al. |
| 5,280,420 A | | 1/1994 | Rapp |
| 5,534,804 A | | 7/1996 | Woo |
| 5,553,030 A | | 9/1996 | Tedrow et al. |
| 5,559,687 A | | 9/1996 | Nicollini et al. |
| 5,612,642 A | | 3/1997 | McClintock |
| 5,636,288 A | | 6/1997 | Bonneville et al. |
| 5,663,907 A | * | 9/1997 | Frayer et al. .......... 365/185.18 |
| 5,672,959 A | | 9/1997 | Der |
| 5,675,280 A | | 10/1997 | Nomura et al. |
| 5,708,608 A | | 1/1998 | Park et al. |
| 5,717,581 A | | 2/1998 | Canclini |
| 5,726,946 A | | 3/1998 | Yamagata et al. |
| 5,760,634 A | | 6/1998 | Fu |
| 5,808,506 A | | 9/1998 | Tran |
| 5,815,435 A | * | 9/1998 | Van Tran .............. 365/185.03 |
| 5,847,441 A | | 12/1998 | Cutter et al. |
| 5,903,031 A | | 5/1999 | Yamada et al. |
| 5,946,258 A | | 8/1999 | Evertt et al. |
| 5,963,412 A | | 10/1999 | En |
| 6,005,423 A | | 12/1999 | Schultz |
| 6,028,324 A | | 2/2000 | Su et al. |
| 6,064,251 A | | 5/2000 | Park |
| 6,075,402 A | | 6/2000 | Ghilardelli et al. |
| 6,081,456 A | | 6/2000 | Dadashev |
| 6,094,095 A | | 7/2000 | Murray et al. |

(List continued on next page.)

FOREIGN PATENT DOCUMENTS

EP 0693781 1/1996

OTHER PUBLICATIONS

Martin, "Improved Circuits for the Realization of Switched--Capacitor Filters", IEEE Transactions on Circuits and Systems, vol. CAS-27, No. 4, Apr. 1980, pp. 237-244.

Primary Examiner—Son Mai
(74) Attorney, Agent, or Firm—Eitan, Pearl, Latzer & Cohen Zedek, LLP

(57) ABSTRACT

According to some embodiments of the present invention, a non-volatile memory cell may be operated using a charge pump circuit. The charge pump circuit may be adapted to output a first and second voltage level, and the charge pump circuit may be connected to a first circuit segment, including a select transistor associated with the memory cell, through a switch. When the charge pump circuit is outputting power at the first voltage level, the switch may be conducting and the select transistor line may be charged. When the charge pump circuit is outputting power at the second voltage level, the switch may be opened and a second circuit segment, including a bit line associated with the memory cell, may be charged.

30 Claims, 5 Drawing Sheets

U.S. PATENT DOCUMENTS

| | | |
|---|---|---|
| 6,107,862 A | 8/2000 | Mukainakano et al. |
| 6,130,572 A | 10/2000 | Ghilardelli et al. |
| 6,130,574 A | 10/2000 | Bloch et al. |
| 6,157,242 A | 12/2000 | Fukui |
| 6,188,211 B1 | 2/2001 | Rincon-Mora et al. |
| 6,198,342 B1 | 3/2001 | Kawai |
| 6,208,200 B1 | 3/2001 | Arakawa |
| 6,246,555 B1 | 6/2001 | Tham |
| 6,297,974 B1 | 10/2001 | Ganesan et al. |
| 6,339,556 B1 | 1/2002 | Watanabe |
| 6,353,356 B1 | 3/2002 | Liu |
| 6,356,469 B1 | 3/2002 | Roohparvar et al. |
| 6,359,501 B2 | 3/2002 | Lin et al. |
| 6,433,624 B1 | 8/2002 | Grossnickle et al. |
| 6,452,438 B1 | 9/2002 | Li |
| 6,654,296 B2 * | 11/2003 | Jang et al. .............. 365/189.09 |
| 6,665,769 B2 | 12/2003 | Cohen et al. |
| 6,677,805 B2 | 1/2004 | Shor et al. |
| 2002/0145465 A1 | 10/2002 | Shor et al. |
| 2003/0202411 A1 | 10/2003 | Yamada |

* cited by examiner

METHOD AND CIRCUIT FOR OPERATING A MEMORY CELL USING A SINGLE CHARGE PUMP

FIELD OF THE INVENTION

The present invention relates to the field of semiconductor memory cells. More specifically, the present invention relates' to the operation (e.g. reading, writing and erasing) of one or more semi-conductor memory cells (e.g. non-volatile EPROM).

BACKGROUND OF THE INVENTION

Non-volatile memory architectures such as EPROM devices usually require operating voltages above voltage supply levels ("VDD") of the integrated circuits ("ICs") on which they reside. For example, in order to perform Program ("PGM"), Read, and/or Erase operations, memory cells according to specific technologies (e.g. NROM) may require voltages of up to 10.5V. To obtain these relatively high voltages, charge-pumps may be utilized to multiply VDD (typically 1.8–3.6V) by some factor. A charge pump's voltage multiplying factor may be a function of the charge pump's circuit configuration, which circuit configuration may include a number of transistor/diode pairs. The size and current consumption of a charge pumps is usually based on the amount of Power (Voltage x Current) the pump must provide.

Various operations or operating modes of a non-volatile memory cell may require distinct voltage and current levels. Typically, since NROM EPROM chips and other memory cell arrays operate in several different modes, where each mode has a distinct voltage and current requirement, multiple charge pumps are required. Table #1 shows the operating modes and typical voltage and current levels of an NROM device.

| Operating Mode | WL Voltage (V) | BL Voltage (V) | BL Current per cell (A) | Select Transistor Voltage (V) |
|---|---|---|---|---|
| READ | 4 | 2 | 10u (programmed bit) 60u (erased bit) | 4–6 |
| PROGRAM | 10.5 | 4–6 (stepped at 200mV) | 250u | 10.5 |
| ERASE | −7 | 4–6 stepped | 1n | 10.5 |

Table 1 lists voltage and current levels which may be required for the three basic operating modes of a non-volatile memory, specifically an NROM in this case. For each mode, the table lists the voltage and/or current levels which may be required for a memory cell's: (1) Word Line ("WL"), which is usually the gate terminal (e.g. of an EPROM); (2) Bit Line ("BL"), which is usually the source or drain terminal of a memory cell; and (3) the gate of one or more select transistors. Since a gate of a memory cell, to which a WL may lead, and a gate of a select transistor are almost purely capacitive loads, there is little to no DC load current associated with either. Thus, no WL or select transistor currents are listed in Table 1. However, since the BL is usually connected to the drain of a memory cell (e.g. EPROM), which is a current loading element, current levels associated with the BL are listed for each of the three possible operations or modes of operation.

FIG. 1 shows a circuit and a method of operating, (e.g. programming) a memory cell according to the prior art, at the voltage levels substantially similar to those listed in table #1. Turning now to FIG. 1, there is shown a block diagram of a circuit architecture which has been utilized to provide pumped voltages to a memory array 100 (e.g. EPROM) through WL 110 and BL 120 during a PGM operation. Based on the address of a memory cell to be programmed, an Xdecoder 200 ("XDEC") may determine which WL 110 to access and may provide voltage to the selected WL 110. All other WLs may be maintained at ground (GND) during PGM. A Y-Muliplexor 300 ("YMUX" or "YM") may access the BL 120 via a select transistor 130, providing positive voltage to the enabled BL 120. Inverters and/or drivers, 140a and/or 140b, may be used to interface the output of XDEC 200 or YMUX 300 with a relevant transistor gate. A High Voltage charge pump 400 ("HV Pump") may provide a regulated 10.5V to the WL 110 and to the select transistor 130. During PGM, the WL 110 may be required to be at or about 10.5V. It is thus convenient to have the select transistor 130 connected to the same IV Pump 400 as the WL 110.

Regulation of the HV Pump 400 may be internal to the HV Pump 400 (as shown as in U.S. patent No. 6,577,514, entitled "Efficient Charge Pump with Constant Boosted Output Voltage" and assigned to the assignee of the present invention) or can be provided by a voltage regulator circuit connected in series between the HV pump and the load (not shown). A second pump, the Drain Pump ("DPUMP") 500, may provide a 7V to 8V supply to a BL regulator 600. The regulator 600 may regulate the output of the DPUMP to a precise trimmed bit line voltage ("VPPD") level. The VPPD/BL voltage level may be adjusted according to a smart programming algorithm to a voltage level between 4V and 7V using small voltage steps or increments (e.g. 200 mV). Although the DPUMP 500 may provide a lower voltage than the HV Pump 400, it may consume more current than the HV Pump 400, since the DPUMP 500 may drive as much as several milli-amperes of current, while in contrast, the load of the HV Pump is substantially capacitive and may require almost no DC current.

As mentioned above, charge pump circuits are required to provide all voltage levels above VDD and below VSS (VSS=GND=0). As seen in FIG. 1, according to the prior art, two or more charge pumps are required on a memory chip. Since each charge pump circuit may have a pumping efficiency (Power Out/Power In) of 20–30% (e.g. each 1 mA of current pumped at 8–10V may require 10–12 mA of VDD current), charge pump currents can comprise the majority of VDD current used by a memory chip. In addition, charge pumps are large circuits and can take up as much as 50% of a chip's die area.

What has been absent from the prior art, and is desired, is a method and circuit capable of driving the WL/select capacitive loads and efficiently driving high currents to the BL at a lower voltage, while avoiding the necessity of having two distinct positive charge pumps. Thus, it would be beneficial to reduce the number of charge pumps required for a non-volatile memory array such as an NROM EPROM array.

SUMMARY OF THE INVENTION

There is therefore provided, in accordance with a preferred embodiment of the present invention, a method and circuit for operating a memory cell, for example programming a memory cell, using a single charge pump. In some embodiment, this is a positive charge pump. The present invention may include a switch connecting an output of a multimode charge pump circuit to a first circuit segment, which first circuit segment may include at least one WL. In some embodiments of the present invention, the first circuit segment may include a gate of a select transistor associated with the at least one WL.

As part of the present invention, when the switch is in conducting mode, the multimode charge pump circuit may provide electrical power at a first current level and a first voltage level intended to raise the voltage of the at least one WL to an operating voltage level. In some embodiments of the present invention, the first voltage level may cause a select transistor associated with the at least one word line to become conducting.

Once the WL's voltage is raised to an operating voltage level, the switch connecting the output of the charge pump circuit to the first circuit segment may be made non-conducting, thereby leaving the first circuit segment in a floating charged state. That is, the voltage in the first circuit segment may remain substantially stable due to the first circuit segment's capacitance and due to negligible leakage paths between the first circuit segment and ground.

Upon making the switch non-conducting, the multimode charge pump circuit may begin outputting power at a second voltage level and a second current level intended to drive a BL of a memory cell associated with the at least one WL whose voltage was raised.

According to some embodiments of the present invention, the multi-mode charge pump circuit may include a multi-mode charge pump. This pump may have self-regulating capabilities, such as the charge pump taught in U.S. Patent No. 6,577,514, entitled "Efficient Charge Pump with Constant Boosted Output Voltage" by Shor et. al. In other embodiments of the present invention, the multimode charge pump circuit may be a combination of a conventional charge pump with an external voltage and/or current regulating circuit. Charge pump circuits are well known, and any such circuit, presently known or to be devised in the future, is applicable to the present invention.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
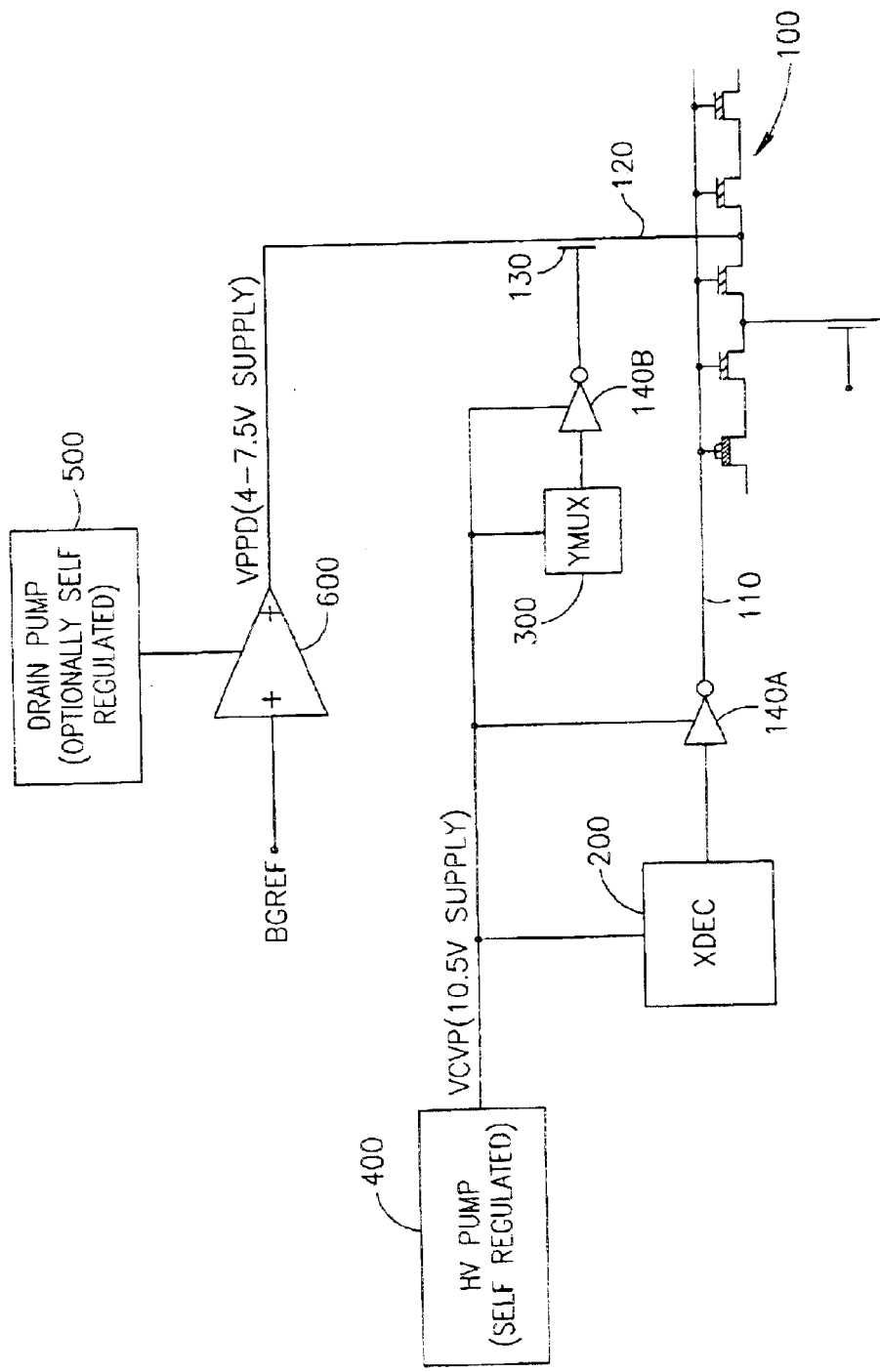
FIG. 1 shows a block diagram of a circuit and a method of operating, (e.g. programming) a memory cell according to the prior art.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

The present invention is a method and circuit for operating a memory cell using a single charge pump. The present invention may include a switch connecting an output of a multimode charge pump circuit to a first circuit segment, which first circuit segment may include at least one WL. In some embodiments of the present invention, the first circuit segment may include a gate of a select transistor associated with the at least one WL.

As part of the present invention, when the switch is in a conducting mode, the multimode charge pump circuit may provide electrical power at a first current level and a first voltage level intended to raise the voltage of the at least one WL to an operating voltage level. In some embodiments of the present invention, the first voltage may cause a select transistor associated with the at least one word line to become conducting.

Once the WL's voltage is raised to an operating voltage level, the switch connecting the output of the charge pump circuit to the first circuit segment may be made non-conducting, thereby leaving the first circuit segment in a charged floating state. That is, the voltage in the first circuit segment may remain substantially stable due to the first circuit segment's capacitance and due to a negligible number of current leakage paths between the first circuit segment and ground.

Upon making the switch non-conducting, the multimode charge pump circuit may begin outputting power at a second voltage level and a second current level intended to drive a BL of a memory cell associated with the at least one WL whose voltage was raised. Once the charge pump completes pumping current through the memory cell, it may be said that an operation on the memory cell has been performed and/or completed.

Figure 2:
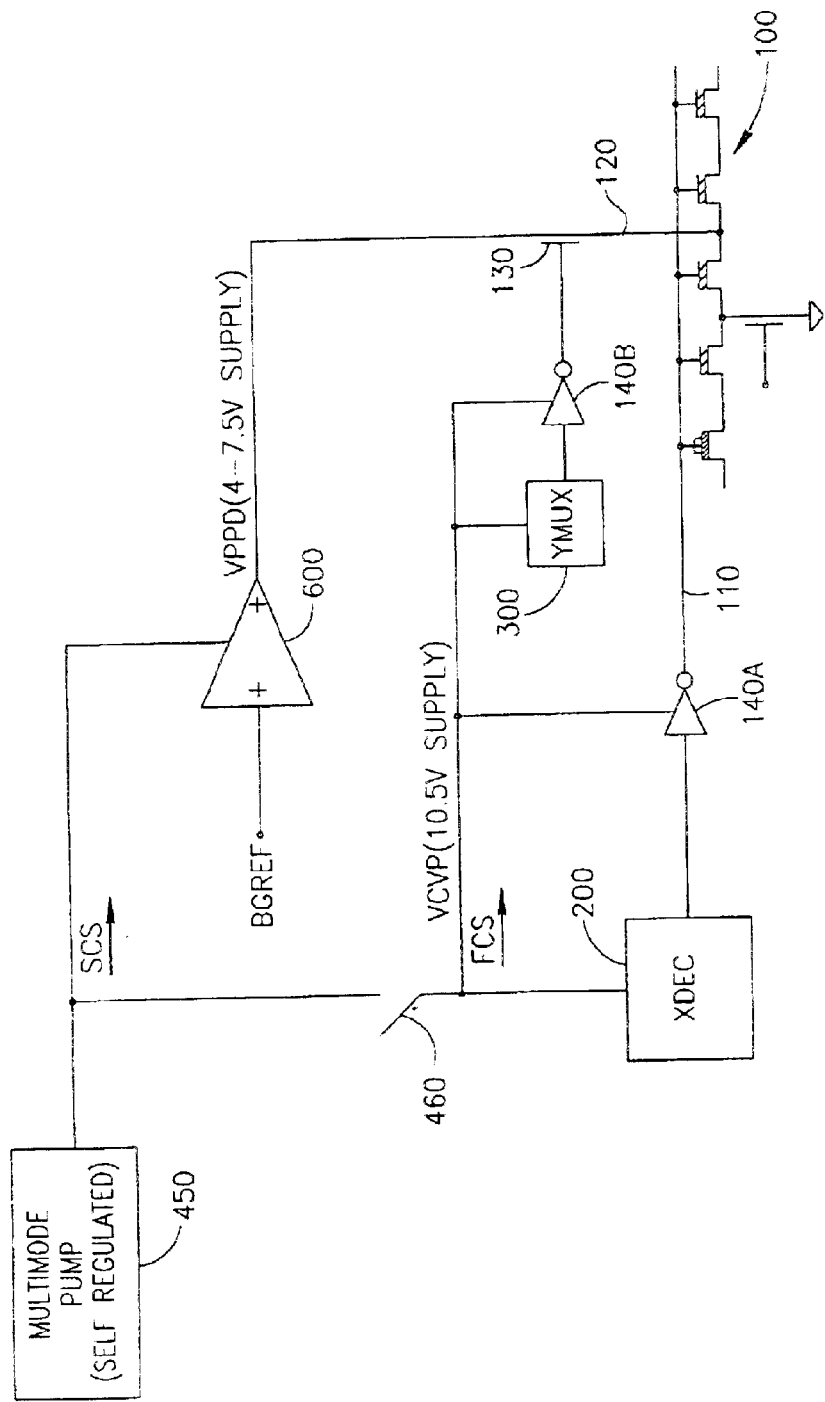
FIG. 2 shows a block diagram of a circuit architecture according to some embodiments of the present invention.

Turning now to FIG. 2, there is shown a block diagram of a circuit architecture according to some embodiments of the present invention. The charge pump circuit 450 may be a multimode charge pump circuit 450 and its output may be connected to a first circuit segments through a switch 460. The first circuit segment may include one or a set of word lines associated with one or more memory cells in a memory array 100. The first circuit segment may also include one or a set of select transistor lines, where each select transistor line may be connected to one or more select transistors 130, and where each select transistor may be associated with one or more memory cells in a memory array 100. Each word line may be accessed via an XDEC 200, and each select transistor line may be accessed via a YMUX 300. Drivers/Inverters 140a and 140b may interface the outputs of the XDEC 200 and YMUX 300, with word line 110 and the select transistor 130 line, respectively.

In some embodiments of the present invention, the multimode pump 450 shown in FIG. 2 may be a self-regulated current pump circuit, such as the one taught in U.S. Patent No. 6,577,514, entitled "Efficient Charge Pump with Constant Boosted Output Voltage" and assigned to the assignee of the present application. A self-regulated pump 450 may have internal regulating circuits which may adjust the internal supply voltage of the pump in order to provide a constant output voltage (e.g. 8V). The multimode pump 450 may adjust its energy intake according to the current and voltage levels it is required to provide. In addition, the output voltage of the pump may be adjusted by a control switch, referred to as a trim. Thus, it can provide both the first voltage for the WL/select, as well as the second voltage for the BL.

Figure 4:
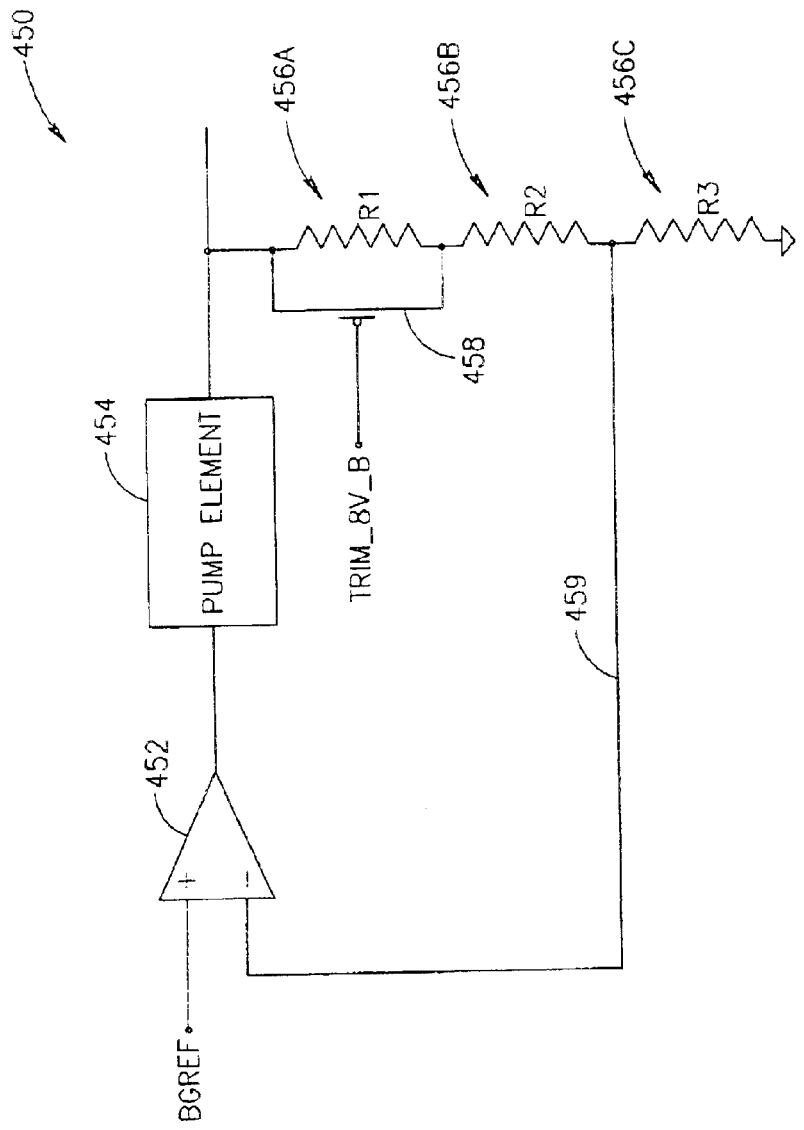
FIG. 4 shows a block diagram of a self-regulated charge pump according to some embodiments of the present invention.

Turning now to FIG. 4, there is shown a block diagram of a self-regulated multimode charge pump 450 according to some embodiments of the present invention. The multimode charge pump 450 may have an Internal Pump Regulator 452 which may receive a reference voltage, BGREF, which may be a DC bias of 1.2V, and which may produce a signal to control the Pump Element 454. The Pump Element 454 may be composed of a series or array of capacitors configured to perform voltage multiplication, and the output of the Pump Element 454 may be connected to ground through a series of resistors 456A, 456B, and 456C. One of the resistors, for example 456a, may be connected in parallel with the source and the drain of a transistor 458. When the transistor 458 is activated, for example, by applying a sufficiently high gate voltage to the transistor's 458 gate, resistor 456a may be shunted and the output voltage of the Pump Element 454 may be forced to drop. Feedback line 459 may provide feedback to the Internal Pump Regulator 452 such that a control signal from the Internal Pump Regulator 452 to the Pump Element 454 is adjusted to compensate for the drop in the output voltage.

The following is an example, with reference to FIG. 2, of one possible method of the present invention by which an operation may be performed on a memory cell using a single multimode charge pump circuit. The operation used for this example is the programming of a memory cell. According to some embodiments of the present invention, the operation of programming may be split into two basic parts or phases, the first of which may be referred to as the WL charge phase and the second of which may be referred to as the BL insertion phase. The WL charge phase may include the following steps performed on a first circuit segment:

1) The switch 460 may be placed in a conducting state;
2) The multimode pump 450 may be set to provide a regulated output of 10.5V;
3) The YMUX 300 logic may set the gate of the select transistor 130 into a logical "0" state which may prevent the BL from charging at this phase; and
4) The XDEC 200 may allow access to a target WL 110, and the WL 110 may charge to 10.5V.

During the BL insertion phase, once the WL is charged, the following steps may be performed on a second circuit segment:

1) The BL regulator 600 may be enabled. The BL regulator 600 may also be enabled during the WL charge phase, so that it may be ready immediately at the beginning of the BL insertion phase. This saves programming time, but costs more current, which is a design tradeoff;
2) The YMUX 300 may set the gate of the select transistor in a logical "1" state, by setting its gate at 10.5V, thereby allowing the BL to charge to between 4V and 7V, based on the regulator trim;
3) Immediately after step (2), the switch 460 may then be opened, leaving it in a non-conducting state. And since the YMUX 300 and XDEC 200 have not changed their states, the WL 110 and select voltages are left floating. The YMUX 300 and XDEC 200 may contain sufficient capacitance to maintain the floating supply at substantially charged level. This may be accomplished as long as voltage loss associated with leakage currents is negligible;
4) The internal regulator of multimode charge pump 450 may adjust the pump's output level to 8V. The multimode charge pump 450 may transition from an output voltage of 10.5V to 8V by discharging. Thus, the load current may drain charge from the multimode charge pump 450 and cause the pump's output voltage to drop until the output levels off at 8V. During discharging from 10.5V to 8V, the multimode charge pump's internal mechanism may provide minimal energy to the pump. Once the pump levels off to 8V, the internal regulator may apply more energy to the pump;
5) During the BL insertion phase, the first circuit segment ("VCVP voltages") remains floating and should substantially maintain its charged voltage level throughout the BL Insertion phase; and
6) The output of multimode charge pump 450 reaches a stable voltage level (e.g. 8V). The BL regulator 600 may regulate the voltage level applied to the drain of the memory cell. For example, VPPD may be stepped to a value between 4V and 7V, depending upon the specifics of the programming algorithm used.

After the BL insertion phase, the multimode charge pump 450 and VCVP voltages can be discharged back to ground or to read levels. In the example given above, a single BL is charged. However, it should be understood by one of ordinary skill in the art that it is possible to access multiple BL or WL during this cycle, thus programming several cells in parallel.

Figure 3:
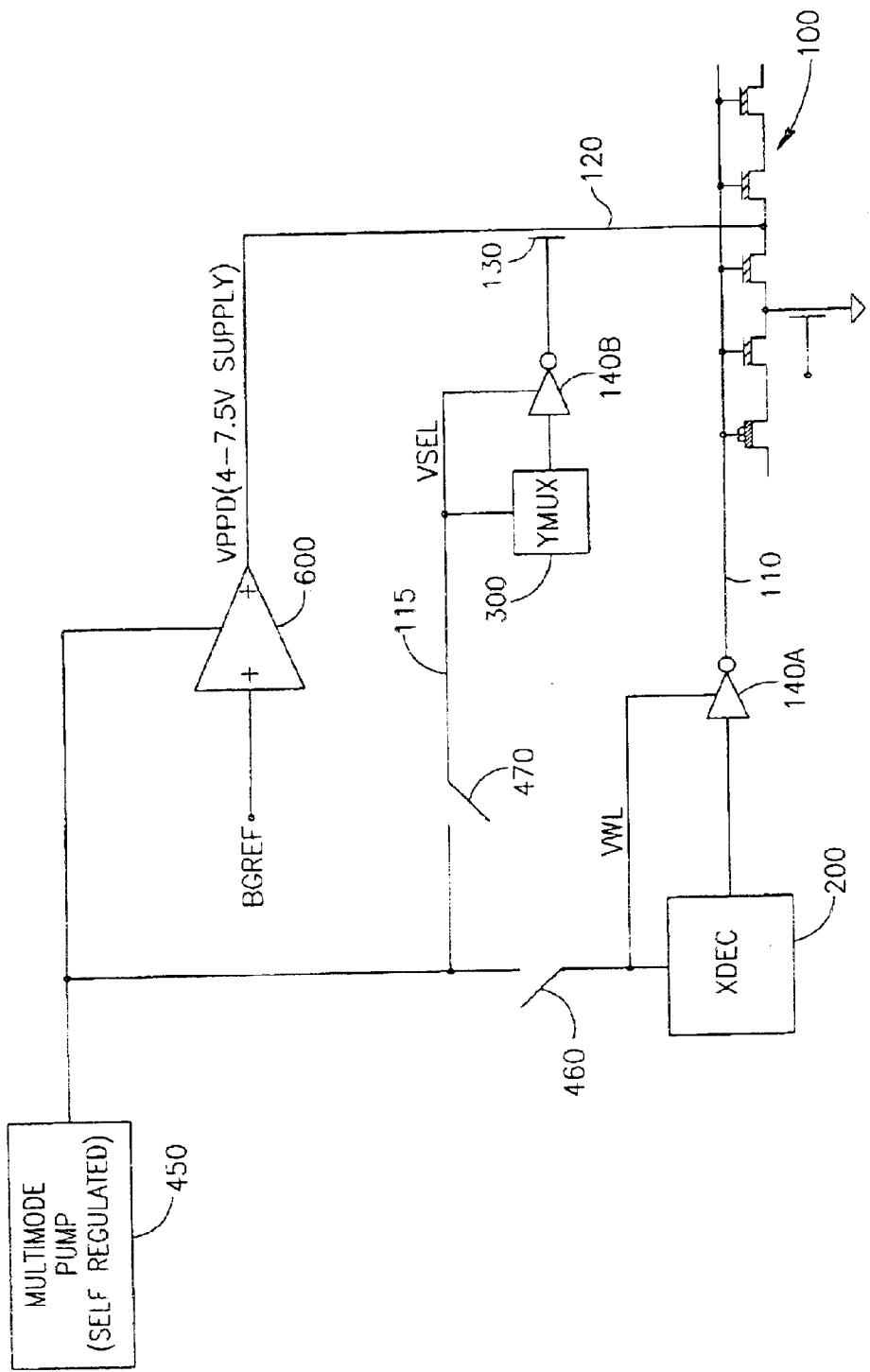
FIG. 3 shows an example of a circuit architecture according to the present invention with which multiple BLs and their associated memory cells may be accessed and charged.

Turning how to FIG. 3, there is an example of a circuit architecture according to the present invention with which multiple BLs and their associated memory cells may be accessed and charged. In the architecture of FIG. 3, there is a single WL 110 access, in which one or more WL 110 may be charged. However, the select transistors 130 may be switched two or more times while the WL 110 is left floating, thereby enabling several BL 120 along the WL 110 to be accessed during the same program cycle. For example, if the multimode charge pump 450 is capable of driving 4 NROM cells in parallel, and the select transistors are switched twice, then 8 cells may be programmed in one cycle. In some examples of the present invention, many sets (e.g. 10 to 20 sets of cells) may be operated while the appropriate word line is kept in a charged state.

The circuit architecture exemplified in FIG. 3 is similar to the one in FIG. 2, with the exception that the first circuit segment, VCVP, is split into two sub-segments, VSEL and VWL, through a WL switch 460 and a VSEL switch 470, respectively. In this manner, the select transistor 130 and WL 110 voltage levels may be controlled independently. The following sequence is an example of a method according to some embodiments of the present invention which may be used to switch between select transistor lines and/or gates, VSEL, during a single program cycle.

Phase I: WL Charge
1) Access may enabled to the WL 110 and by XDEC 200;
2) Both the WL 460 and VSEL 470 switches may be in a conducting state;
3) Charge pump 450 may provide power at 10.5V; and
4) The YMUX 300 may set the select in a logical "0" state.

Phase II: BL insertion
1) The BL regulator 600 may be enabled;
2) The YMUX 300 may be set the select transistor in a logical "1" state, by setting its gate voltage at 10.5V;

3) Both VSEL 470 and WL 460 switches may be opened (i.e. made non-conducting), and VSEL and VWL may be left in a charged floating state; and 4) The multimode charge pump 450 may then be regulated to an 8V voltage level. The BL regulator 600 may regulate the voltage level applied to the drain of the memory cell.

5) The EPROM cells whose drains are connected to the BL's defined by the conducting select transistor are now programmed.

Phase III: Select Switch—In order to switch the select transistors and program a new set of cells associated with another set of select transistors.

1) The currently conducting select transistor may be set to a logical '0' by applying GND to its gate;

2) The multimode charge pump 450 may be ramped back up to 10.5V; and

3) The VSEL 470 switch may be placed in a conducting state.

Phase IV: Second BL insertion

1) The YMUX 300 may set a new select transistor in a logical "1" state, by setting its gate voltage at 10.5V, after which the BL may be charged as described above;

2) The VSEL switch 470 may be made non-conducting. VSEL and the select may be left floating; and 3) The multimode charge pump 450 may be regulated back to an 8V level. The BL regulator 600 may regulate the voltage level applied to the drain of the memory cell.

4) The EPROM cells whose drains are connected to the BL's defined by the newly conducting select transistor are now programmed.

The specific steps described above are related to the operation of programming a memory cell within a memory array 100. However, according to some embodiments of the present invention, a memory cell may also be read and erased.

Figure 5:
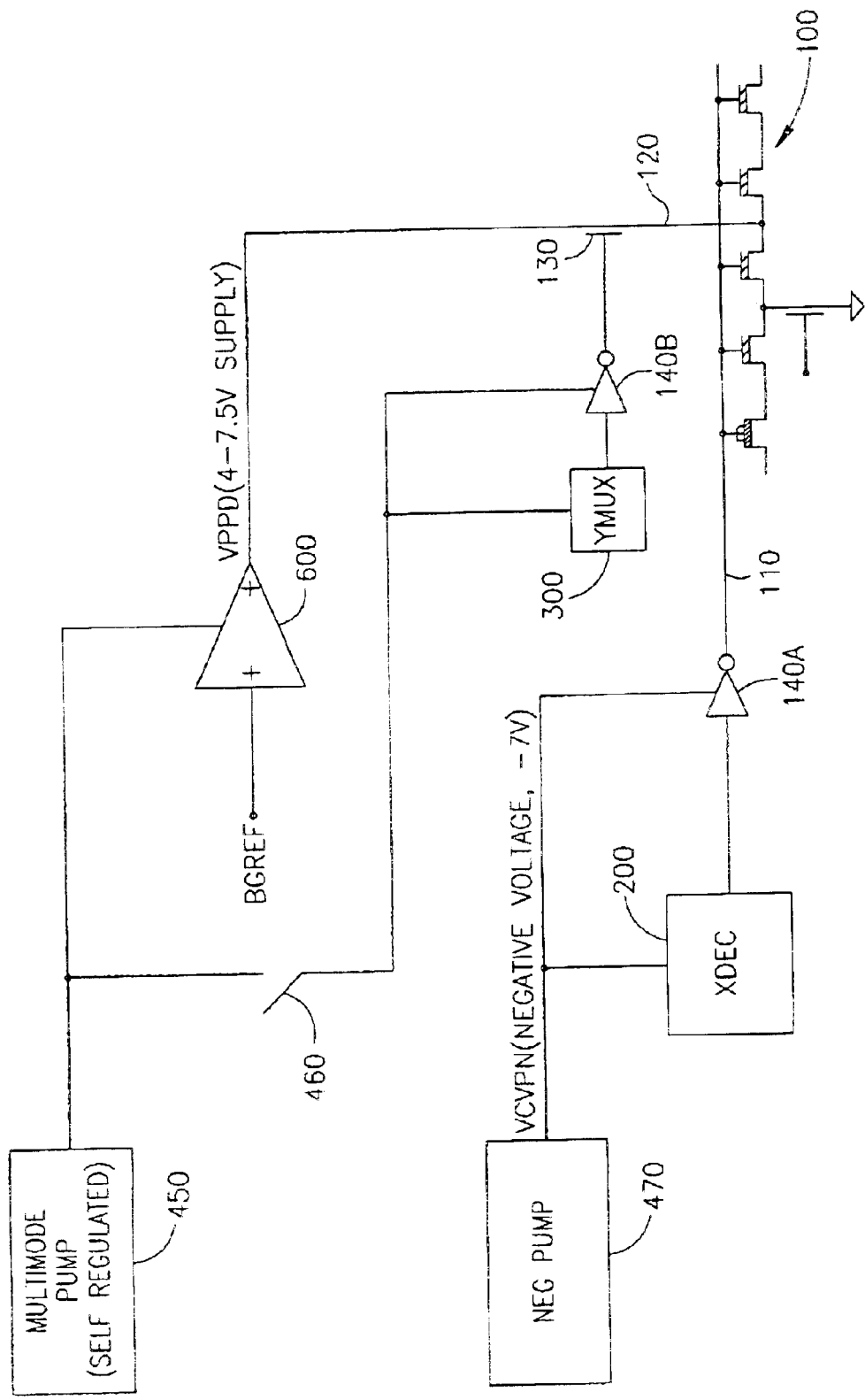
FIG. 5 shows a circuit architecture by which a memory cell may be erased according to some embodiments of the present invention.

Turning now to FIG. 5, there is shown a circuit architecture by which a memory cell may be erased according to some embodiments of the present invention. In FIG. 5, the WL 110 may be driven by a negative charge pump 470 to a required voltage, VCVPN (e.g. −7V). The select lines and transistors 130 may be driven to 10.5V by a multimode pump 450. Following the charging of the select transistors and the making non-conductive of switch 460, the BL 120 may be driven by a second mode of the multimode charge pump 450.

In general, the BL current required during an erase operation is much lower than the BL current required for programming. Typically, an erase operation may require a BL current of only about 30 uA, whereas a programming BL current may be as high as 250 uA. Thus, if a small number of bits are erased, it may not be necessary to "Boat" the select, as the multimode pump may be able to drive the low erase currents, even at 10.5V. However, if a high degree of parallelism in erasing is required (i.e. many bits being erased), or if a low-power mode is desired, the select line may be floated and the Pump adjusted to a lower voltage, such as 8V, to drive the BL regulator.

During a read operation, the BL 120 is very often regulated to a voltage lower than VDD, as shown in table 1. In such a situation, a single charge pump is sufficient to supply the WL to the required voltage, often via a regulator. This can be the same multimode pump used for program and erase operations. During a read operation, the pump may be set to a lower voltage. If a read operation would require the BL 120 to be boosted above VDD, the present invention may utilize "floating" of the WL 110 as well.

It will be appreciated by persons skilled in the art that the present invention is not limited to what has been particularly shown and described hereinabove. Rather the scope of the present invention is defined only by the claims that follow:

What is claimed is:

1. A method of operating a memory cell comprising;
using a charge pump circuit whose output is at a first voltage level and at a first current level to charge a first circuit segment including a select transistor associated with the memory cell;
disconnecting the first circuit segment from the charge pump circuit; and
setting the charge pump circuit to output a second voltage level and a second current level and charging a second circuit segment including a bit line associated with the memory cell.

2. The method according to claim 1, further comprising setting the charge pump circuit to the first voltage level and to the first current level.

3. The method according to claim 1, wherein a self-regulating charge pump is used.

4. The method according to claim 2, wherein setting the charge pump circuit to either a first or a second voltage level comprises adjusting a control signal to the charge pump circuit.

5. The method according to claim 1, further comprising charging at least one word line connected to the first circuit segment and associated with the memory cell.

6. The method according to claim 2, wherein setting the charge pump circuit to either a first or a second voltage level comprises adjusting a control signal to a regulator connected to an output of the charge pump circuit.

7. The method according to claim 1, wherein disconnecting the first circuit segment from the charge pump circuit causes the first circuit segment be in a charged floating state.

8. The method according to claim 1, wherein said operation means reading.

9. The method according to claim 1, wherein said operation means erasing.

10. The method according to claim 2, wherein said operation means programming.

11. A circuit for operating a memory cell comprising:
a charge pump circuit to provide power at two or more voltage levels, and
a switch to connect said charge pump to a first circuit segment including a select transistor associated with the memory cell when said charge pump is providing power at a first voltage level to said first circuit segment, wherein said switch may be made non-conducting when said charge pump is providing power at a second voltage level.

12. The circuit according to claim 11, wherein said first circuit segment includes at least one word line associated with the memory cell.

13. The circuit according to claim 11, wherein said charge pump is self regulated.

14. The circuit according to claim 11, further comprising a second circuit segment including a bit line associated with the memory cell, wherein said charge pump is connected to said second circuit segment when operating at the second voltage level.

15. The circuit according to claim 14, wherein said second circuit segment includes a voltage regulator circuit which is connected between the charge pump output and the bit line of the memory cell.

16. The circuit according to claim 12, wherein said word line is left floating when said charge pump is at the second voltage level.

17. The circuit according to claim 11, wherein said first circuit segment is left floating when said charge pump is at the second voltage level.

18. The circuit according to claim 11 wherein operating means reading.

19. The circuit according to claim 11 wherein operating means erasing.

20. The circuit according to claim 12 wherein operating means programming.

21. A circuit for operating a memory cell comprising:
   a charge pump circuit to provide power at two or more voltage levels, and
   a switch to connect said charge pump to a first circuit segment including a word line associated with the memory cell when said charge pump is providing power at a first voltage level to said first circuit segment, wherein said switch may be made non-conducting when said charge pump is providing power at a second voltage level.

22. The circuit according to claim 21, wherein said first circuit segment includes at least one select transistor associated with the memory cell.

23. The circuit according to claim 21, wherein said charge pump is self regulated.

24. The circuit according to claim 21, further comprising a second circuit segment including a bit line associated with the memory cell, wherein said charge pump is connected to said second circuit segment when operating at the second voltage level.

25. The Circuit according to claim 24, wherein said second circuit segment includes a voltage regulator circuit which is connected between the charge pump output and the bit line of the memory cell.

26. The circuit according to claim 22, wherein said select transistor is left floating when said charge pump is at the second voltage level.

27. The circuit according to claim 21, wherein said first circuit segment is left floating when said charge pump is at the second voltage level.

28. The circuit according to claim 21 wherein operating means reading.

29. The circuit according to claim 21 wherein operating means erasing.

30. The circuit according to claim 22 wherein operating means programming.

* * * * *